US011829217B2

(12) United States Patent
Han

(10) Patent No.: US 11,829,217 B2
(45) Date of Patent: Nov. 28, 2023

(54) ASYNCHRONOUS TEMPERATURE CONTROL INTEGRATED DEVICE

(71) Applicant: EVGA CORPORATION, New Taipei (TW)

(72) Inventor: Tai-Sheng Han, New Taipei (TW)

(73) Assignee: EVGA CORPORATION, New Taipei (TW)

( * ) Notice: Subject to any disclaimer, the term of this patent is extended or adjusted under 35 U.S.C. 154(b) by 190 days.

(21) Appl. No.: 17/405,046

(22) Filed: Aug. 18, 2021

(65) Prior Publication Data

US 2021/0373629 A1    Dec. 2, 2021

Related U.S. Application Data

(63) Continuation-in-part of application No. 15/436,736, filed on Feb. 17, 2017, now abandoned.

(30) Foreign Application Priority Data

Dec. 30, 2016  (TW) .................................. 105220092

(51) Int. Cl.
*G06F 1/26* (2006.01)
*G06F 1/20* (2006.01)
*H05K 7/20* (2006.01)
*G08B 5/36* (2006.01)
*G08B 21/18* (2006.01)

(52) U.S. Cl.
CPC ................ *G06F 1/206* (2013.01); *G06F 1/26* (2013.01); *G08B 5/36* (2013.01); *G08B 21/18* (2013.01); *H05K 7/20209* (2013.01)

(58) Field of Classification Search
None
See application file for complete search history.

(56) References Cited

U.S. PATENT DOCUMENTS

| 2010/0280680 | A1* | 11/2010 | Angell | G06F 1/206 700/36 |
| 2014/0036443 | A1* | 2/2014 | Xu | H05K 7/20209 165/247 |
| 2014/0203938 | A1* | 7/2014 | McLoughlin | A62C 99/009 340/584 |

* cited by examiner

*Primary Examiner* — Paul Yen
(74) *Attorney, Agent, or Firm* — Leong C. Lei

(57) ABSTRACT

An asynchronous temperature control integrated device includes a graphics card body including a graphics processor and a power supply circuit, at least one external fan connection port, a first heat dissipation device, at least one first temperature sensor, a second heat dissipation device, a plurality of second temperature sensors, a plurality of light emission elements, and a control device including an externality control member, a high-power drive module, and a scenario database. Thus, two groups of heat dissipation device and temperature sensor are provided to respectively detect the temperatures of two major heat sources on the graphics card body, and the heat dissipation performances of the two heat dissipation devices are individually controllable to make timely and efficient operations of the heat dissipation devices, and also to collaboratively drive an external fan to thereby enhance overall airflow, reduce system internal temperature, and achieve bettered conditions of temperature control.

10 Claims, 10 Drawing Sheets

ASYNCHRONOUS TEMPERATURE CONTROL INTEGRATED DEVICE

CROSS-REFERENCE TO RELATED APPLICATIONS

This is a continuation-in-part of co-pending U.S. patent application Ser. No. 15/436,736 filed on Feb. 17, 2017.

TECHNICAL FIELD OF THE INVENTION

The present invention relates generally to an asynchronous temperature control integrated device, and more particularly to an asynchronous temperature control integrated device that conducts an instantaneous and effective driving operation, in a manner of being free of extra power consumption, on individual heat sources located on a graphics card to individually control heat dissipation devices associated with the heat sources and is also operable to drive an external fan in a collaborative manner.

DESCRIPTION OF THE PRIOR ART

The advent of the high image quality era causes display screens, such as televisions, computers, game consoles, and movies evolving step by step from DVD, blue ray, to 4K, among which a major difference is "definition" or "resolution". For computers, a high-resolution image means computations on an increased number of pixels. Thus, in addition to the performance of the central processing unit, the performance of a graphics card also imposes a direct influence on the quality of a displayed image. And, accordingly, the amount of heat generated during the operation of hardware must be greatly increased. Effective and timely removal of thermal energy generated by a large number of heat sources (including a central processing, a graphics card, and a power supply device) is now one of the major factors that affect long-term operation of modern computers.

Considering a heat dissipation fan, a high-speed operation indicates a high efficiency of heat dissipation and would also amount to increasing accumulation of power consumption. If heat is not properly and timely removed, then the hardware might get down due to heat, and on the other hand, continuously keeping heat speed operation would consume a large amount of electrical power and may burden the power supply device. Considering policies of energy saving and carbon reduction, the manufacturers have proposed a fan speed control system that detects the temperature of a heat source and synchronously adjusts the rotational speeds of all fans. For example, when the heat source is at a lower temperature, all the fans are set to operate at lower speeds; and when the heat source is at a higher temperature, all the fans are put in high-speed operations.

However, such a known fan speed control system, when put into use, suffers certain problems that may need further improvements:

(1) There may be differences of temperature among all the heat sources and control of adjusting rotational speeds in a synchronous manner may suffer difficulty for decision making. If a low-temperature heat source is taken as a reference for adjustment, then the heat generated by a high-temperature heat source may not be effectively removed. On the other hand, if the high-temperature heat source is taken as a reference, then extra electrical power may get wasted at the low-temperature heat source.

(2) The rotational speeds of the fans are adjusted in a passive manner according to the measurements of temperatures. Thus, when a heat source is put into high power operation and thus generates a huge amount of heat, adjusting the rotational speeds in such a way may not be timely responsive and the heat source may reach a temperature beyond a tolerable upper temperature limit.

(3) The fan on the graphics card is independent of an external fan and the rotational speeds thereof can only be controlled separately, making it impossible to control and manage an overall airflow inside a computer enclosure or case.

SUMMARY OF THE INVENTION

The primary objective of the present invention is to conduct temperature monitoring for heat sources located at different sites on a graphics card and to individually control heat dissipation devices at locations corresponding to different ones of the heat sources such that amounts of output power of the heat dissipation devices are generally proportional to the temperatures of the heat sources, and to even further drive, in a collaborative manner, an external fan to enhance overall airflow, reduce system internal temperature, and achieve bettered conditions of temperature control.

To achieve the above objective, the present invention provides a structure that comprises: a graphics card body, the graphics card body comprising a graphics processor and a power supply circuit arranged at one side of the graphics processor, and at least one external fan connection port. A first heat dissipation device is arranged on the graphics processor and at least one first temperature sensor is arranged at one side of the first heat dissipation device. A second heat dissipation device is arranged on the power supply circuit and a plurality of second temperature sensors are arranged at one side of the second heat dissipation device. Further provided on graphics card body are a plurality of light emission elements that are electrically connected with the first temperature sensor and the second temperature sensors and a control device. The control device is operable to individually control heat dissipation performances of the first heat dissipation device and the second heat dissipation device. The control device is provided therein with an externality control member that is electrically connected with the external fan connection port, a high-power drive module, and a scenario database electrically connected with the high-power drive module.

A user, when operating the present invention, may find that two major heat sources of the graphics card body (which are respectively the graphics processor and the power supply circuit) are each provided with a heat dissipation device and the temperatures of the two heat sources are respectively detected by the first temperature sensor and the second temperature sensors so that the control device may regulate the output power of the first heat dissipation device or the second heat dissipation devices individually, based on the results of detection to correspondingly handle different levels of heat generation. As such, excessive consumption of electrical power can be avoided and the amounts of output power of the heat dissipation devices can be adjusted in a timely and individual manner. Further, the graphics card body is connected, via the external fan connection port, with an external fan arranged on a computer enclosure or case to thereby enhance overall airflow, reduce system internal temperature, and achieve bettered conditions of temperature control.

Thus, the present invention may overcome the drawbacks of the known fan speed control systems that suffer shortcoming by synchronously adjusting the rotational speeds of the fans that may not timely responsive to desired heat dissipation performance and may consume extra electrical power.

DETAILED DESCRIPTION OF THE PREFERRED EMBODIMENT

Figure 1:
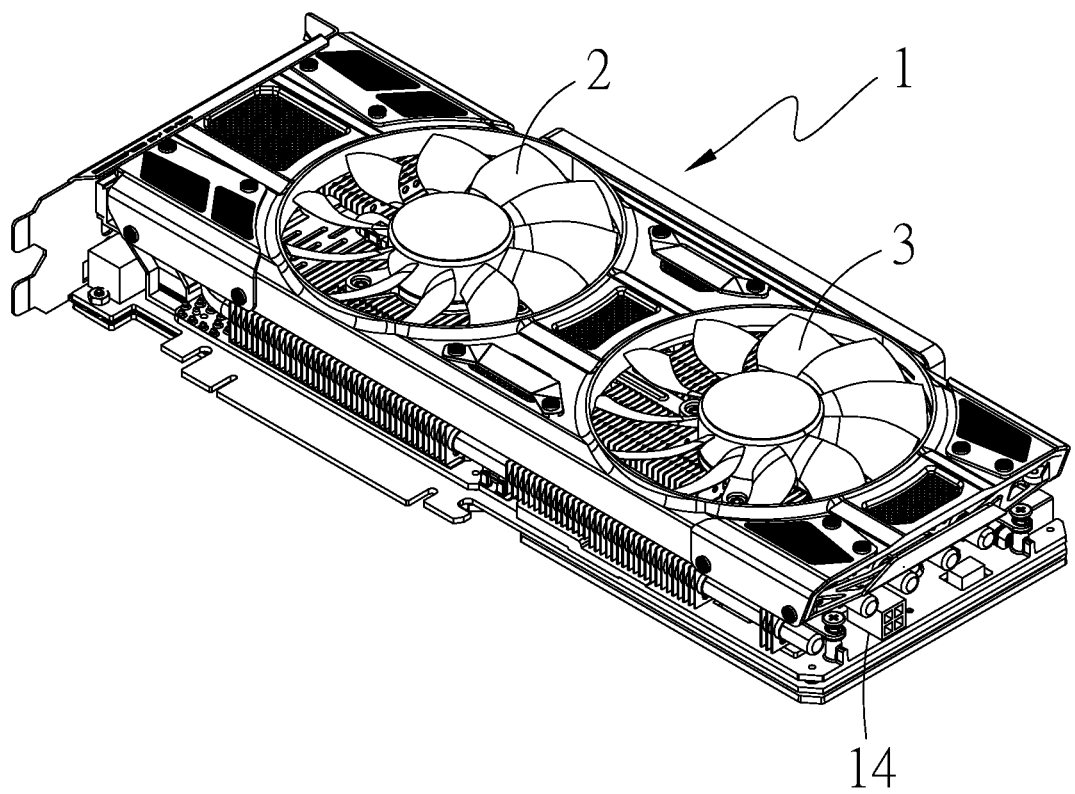
FIG. 1 is a perspective view showing a preferred embodiment of the present invention.
Figure 2:
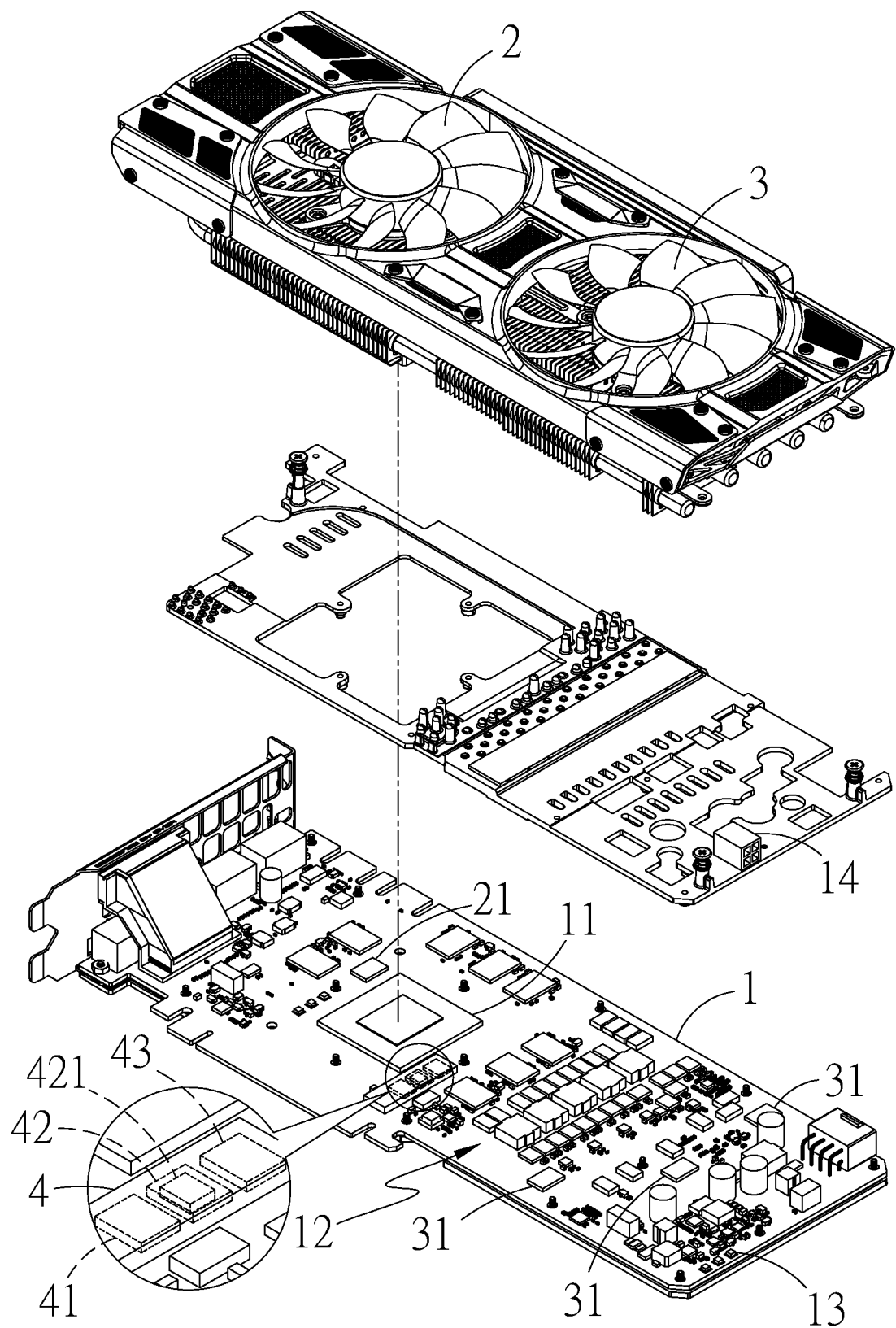
FIG. 2 is an exploded view showing the preferred embodiment of the present invention.

Referring to FIGS. 1 and 2, it can be clearly seen that the present invention comprises:
 a graphics card body 1, the graphic card body 1 comprising a graphics processor 11 and a power supply circuit 12 arranged at one side of the graphics processor 11;
 at least one external fan connection port 14, which is arranged on the graphics card body 1;
 a first heat dissipation device 2, which is arranged on the graphics processor 11, a heat dissipation fan being taken as an example in the present invention;
 at least one first temperature sensor 21, which is arranged at one side of the first heat dissipation device 2;
 a second heat dissipation device 3, which is arranged on the power supply circuit 12, a heat dissipation fan being taken as an example in this invention;
 a plurality of second temperature sensors 31, which are arranged at one side of the second heat dissipation device 3;
 a plurality of light emission elements 13, which are arranged on the graphics card body 1 and are electrically connected with the first temperature sensor 21 and the second temperature sensors 31 to issue temperature alarms with different colors of light;
 a control device 4, which is arranged on the graphics card body 1 and is electrically connected to the first temperature sensor 21 and the second temperature sensors 31 to individually control heat dissipation performances of the first heat dissipation device 2 and the second heat dissipation device 3;
 an externality control member 43, which is arranged in the control device 4 and is electrically connected to the external fan connection port 14;
 a high-power drive module 41, which is arranged in the control device 4 for driving, in a forced manner, the first heat dissipation device 2 and the second heat dissipation device 3 to generate maximum available output power;
 a scenario database 42, which is arranged in the control device 4 and is electrically connected to the high-power drive module 41 to store therein at least one high-power program list; and
 a detection unit 421, which is arranged in the scenario database 42 to detect an operation of activation/deactivation of a high-power program.

As shown in FIGS. 1-4, it can be clearly seen from these drawings that the present invention is structured such that the first heat dissipation device 2 and the second heat dissipation device 3 are respectively and directly set on two major heat sources, which are respectively the graphics processor 11 and the power supply circuit 12, of the graphics card body 1 and the first and second temperature sensors 21, 31 are arranged to detect the temperatures of the two heat sources and transmit temperature data measured thereby to the control device 4, such that the control device 4 is operable to apply individual and different controls of heat dissipation performance (such as different rotational speeds of fans) to different ones of the heat sources according to the temperature data thereof. For example, when the temperature data of the first temperature sensor 21 is 70° C. and the temperature data of the second temperature sensors 31 is 50° C., the control device 4 sets the rotational speed of the first heat dissipation device 2 to 2,000 rpm and sets the rotational speed of the second heat dissipation device 3 to 500 rpm, and uses a single color, or multiple colors, or a mixture of colors of the light emitting from the light emission elements 13 to reflect the status of temperature conditions. As such, different performances or operations of heat dissipation are applied according to different levels of heat generated, in order to allow individual ones of the heat dissipation devices associated with various heat sources on the graphics card body 1 to be operated in an asynchronous manner so that electrical power can be distributed, in a more efficient way, to fans that are necessarily set at relatively high rotational speeds. Result of such an asynchronous control operation is shown, as an example, in FIG. 4, wherein the activation threshold temperatures of the first heat dissipation device 2 and the second heat dissipation device 3 are respectively 20° C. and 40° C., and the first heat dissipation device 2 and the second heat dissipation device 3 are operating at the maximum rotational speed at a temperature of 80° C., of which the rotational speeds are respectively 3,000-3,500 rpm and 2,000 rpm.

The power supply 12 of the graphics card body 1 may be made up of by more than one component (such as multiple components), and in actual operations, it is often that the temperatures of such components are different. For example, detection was made to component A of such multiple components in a known device; however, another component B may suffer a temperature that is higher than the temperature of component A, yet such a high temperature is not detected and identified. Thus, as shown in FIG. 2, the present invention provides a solution in which multiple ones of the second temperature sensor 31 are involved to be respectively arranged beside some of such multiple components that may easily generate high heat in order to detect the highest one of the temperatures of such components that is taken as a reference for controlling the second heat dissipation device 3 thereby achieving a more accurate control and preventing such components from burning down.

Figure 3:
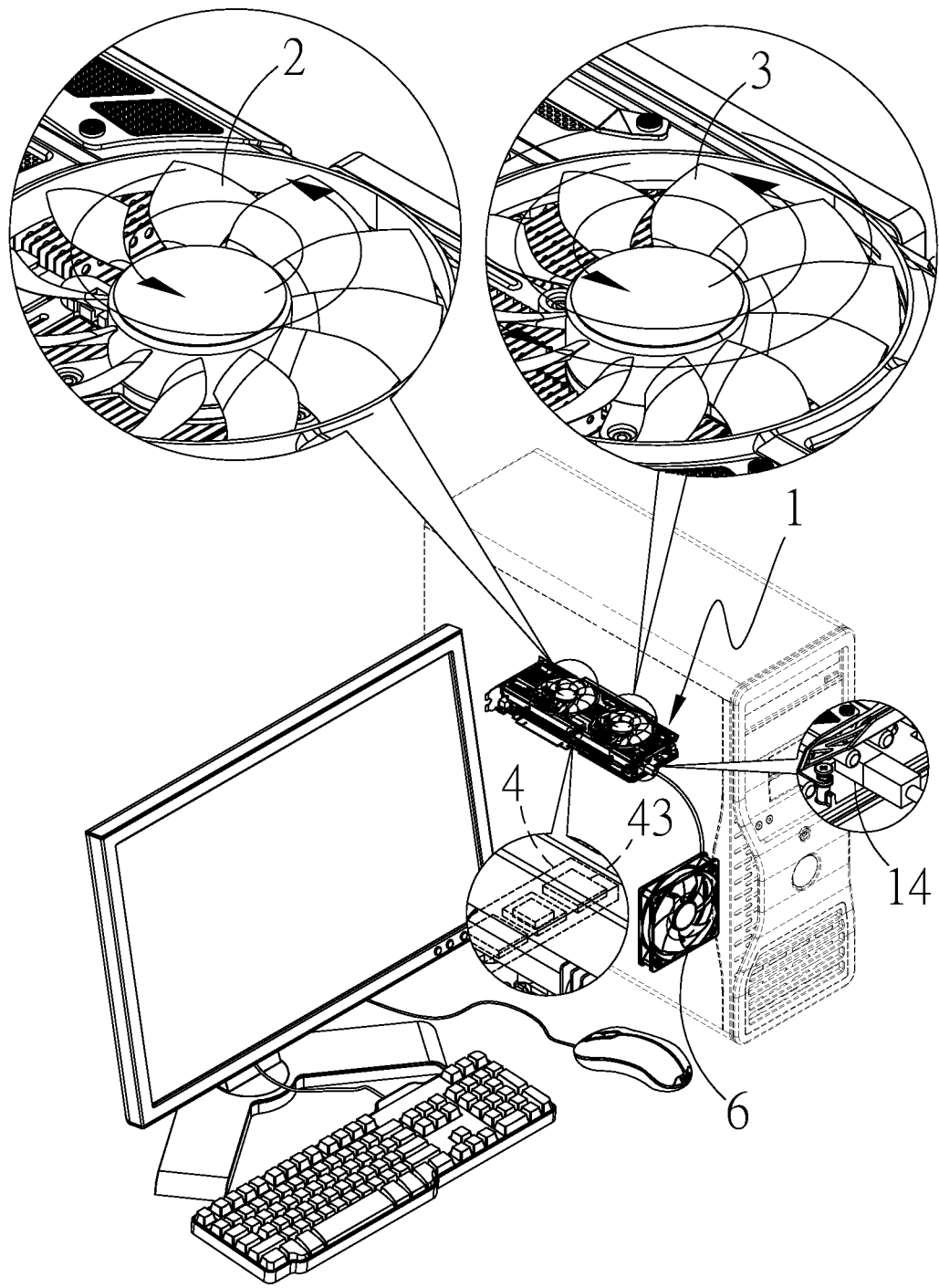
FIG. 3 is a schematic view showing an application of the preferred embodiment of the present invention.
Figure 4:
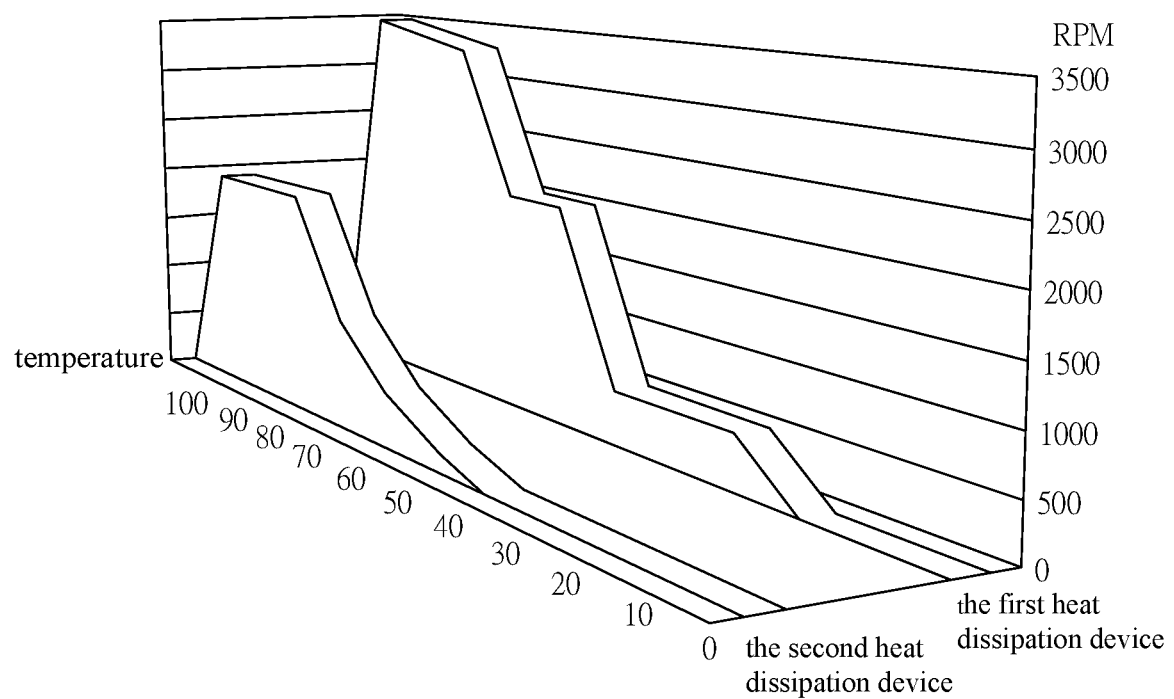
FIG. 4 is a plot showing a temperature-rotational speed relationship according to the preferred embodiment of the present invention.

As shown in FIG. 3, an external fan 6 is referred to a fan that is not mounted on the graphics card body 1 and can be for example a fan mounted on an enclosure or case or a fan mounted on a power supply device. The external fan connection port 14 is provided for connection with such an external fan 6, such that operation of the external fan 6 is controlled by a control signal transmitted from the control device 4 through the externality control member 43. Such a control signal is applied to directly regulate an electrical signal (such as a voltage demand value) supplied to the external fan 6, without the need for transmission through a central processing unit (CPU) or a main board. As such, the heat dissipation system of the graphics card body 1 and a heat dissipation system of a computer enclosure or case are integrated for collaborating with the first heat dissipation device 2 and the second heat dissipation device 3 to enhance overall smoothness of air flows, assisting discharge of hot air from inside the enclosure or case, and reducing the internal temperature of the system to thereby achieve a bettered temperature control condition.

Figure 5:
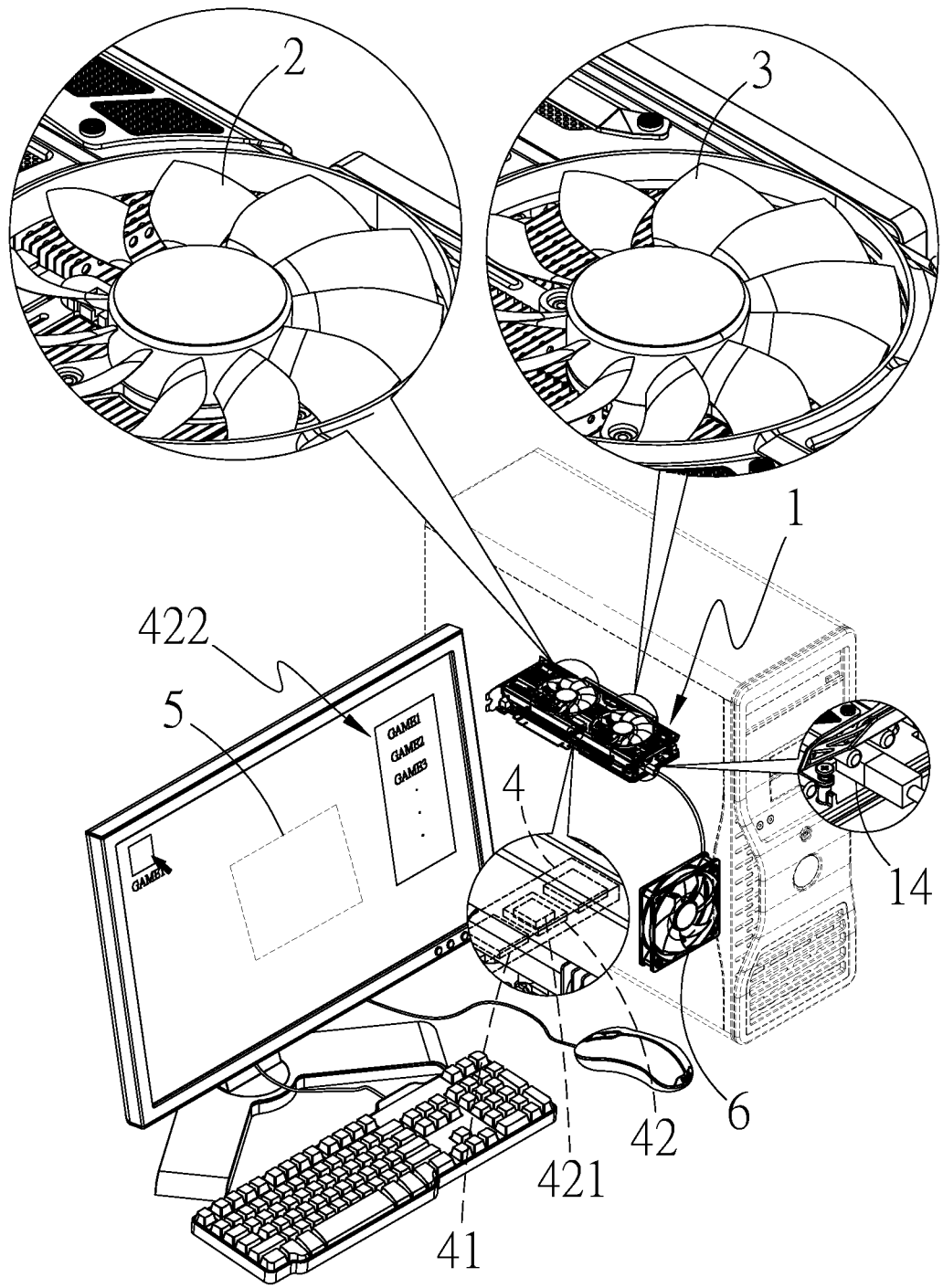
FIG. 5 is a schematic view showing an application of a preferred embodiment of the present invention.
Figure 6:
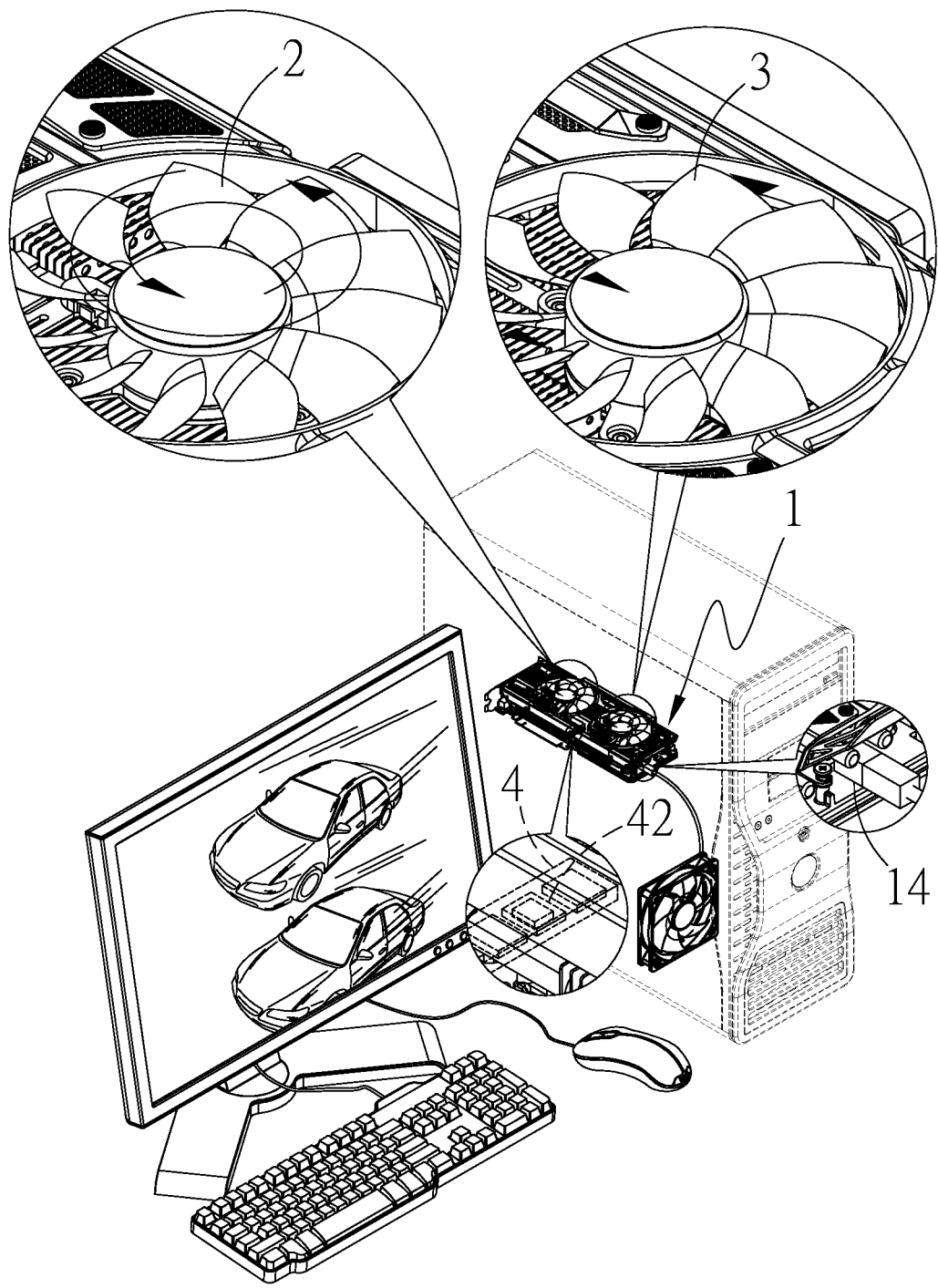
FIG. 6 is another schematic view showing an application of the preferred embodiment of the present invention.
Figure 7:
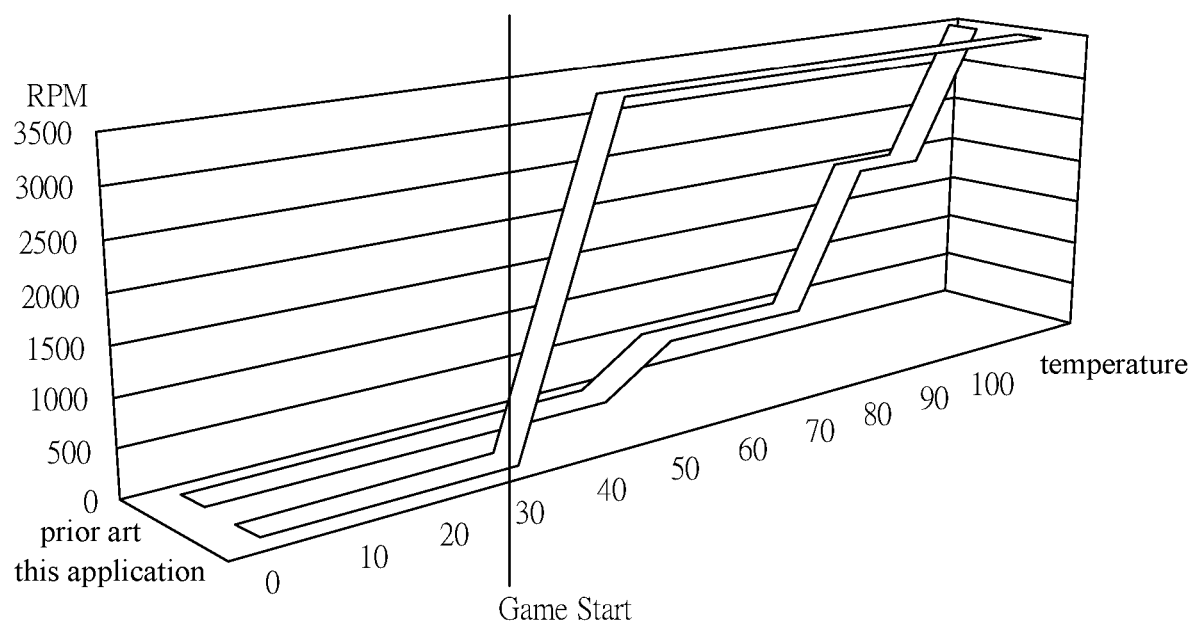
FIG. 7 is a plot showing a temperature-rotational speed relationship according to the preferred embodiment of the present invention.

In FIGS. 5-7, the instant embodiment is generally similar to the previous embodiment and a difference is that a high-power drive module 41 is arranged in the control device 4 for driving, in a forced manner, the first heat dissipation device 2 and the second heat dissipation device 3 to each generate the maximum available output power. The control device 4 comprises a scenario database 42 that is electrically connected to the high-power drive module 41 for storing therein at least one high-power program lost 422. The scenario database 42 comprises a detection unit 421, which detects an operation of activation/deactivation of a high-power program. As such, a user may operate a control module 5 to build up the high-power program list 422 (such as one including a full 3D game program) in the scenario database 42, so that when such a program is activated, a detection operation performed by the detection unit 421 could issue and transmit a signal notifying the high-power drive module 41 as a drive command to drive, in a forced manner, the first heat dissipation device 2 and the second heat dissipation device 3 to the maximum output power (as shown in FIG. 7, in which in the present invention, when the fan is activated, the temperature is only 30° C., at which a known fan does not go into operation, but would, as taught in the present invention, rush to 3,500 rpm if driven by the high-power drive module 41, while the prior art only gradually increases the rotational speed upon passively detecting temperature rise), thereby providing an environment of high heat dissipation performance before temperature rise starts on the graphics card body 1 to directly prevent, in advance, generation of a high temperature situation. An example of the control module 5 is a user interface.

Figure 8:
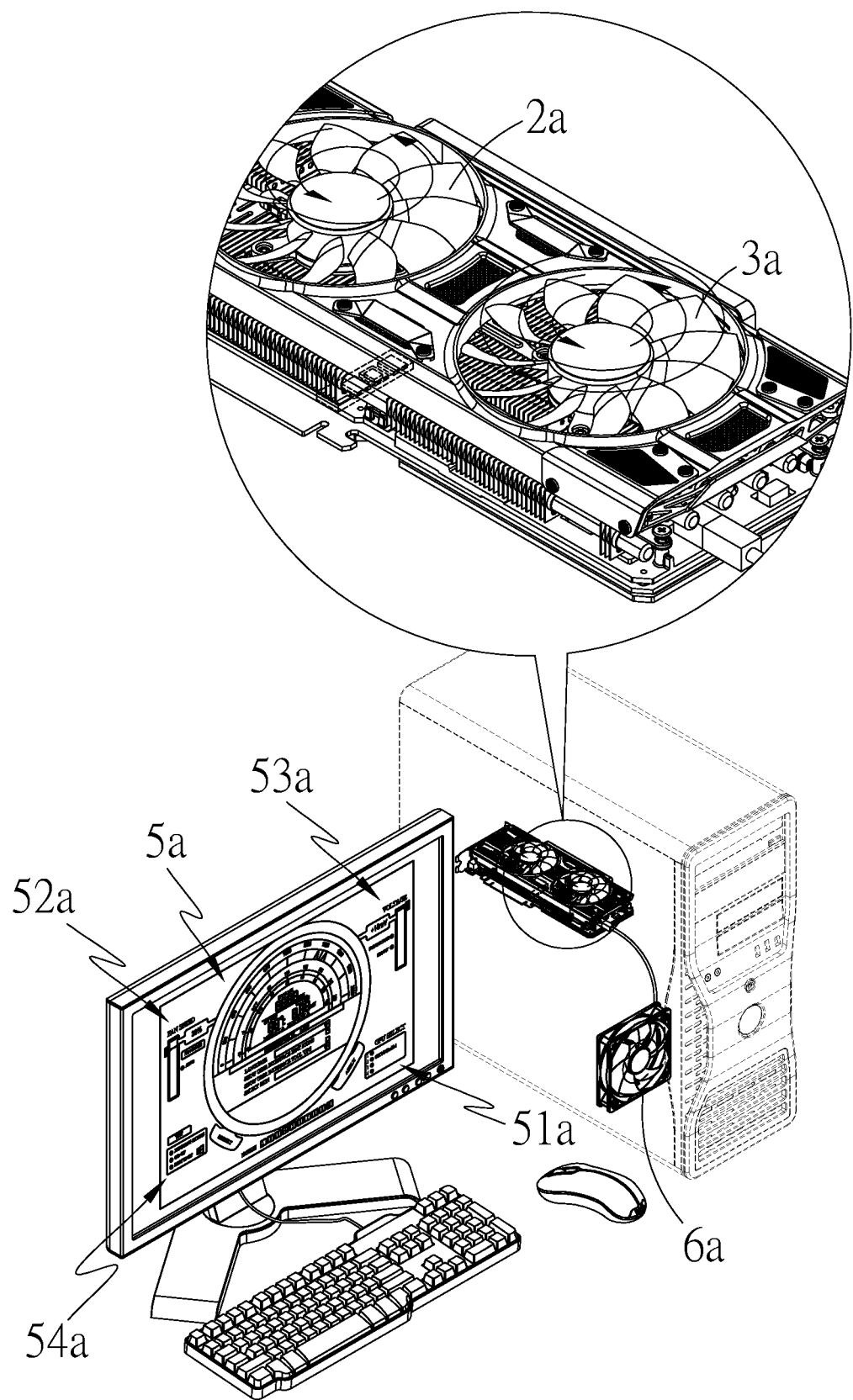
FIG. 8 is a schematic view showing a control interface of another preferred embodiment of the present invention.

In FIG. 8, the instant embodiment is further such that a first temperature control unit 51a, a second temperature control unit 52a, a light control unit 53a, and an integrated control unit 54a are provided in the control module 5a. The first temperature control unit 51a is operable to set temperature thresholds, which are for driving the first heat dissipation device 2a and the second heat dissipation device 3a, and amounts of output power. The second temperature control unit 52a is operable to set a temperature threshold for driving the external fan 6a and an output of power. The light control unit 53a is operable to set colors of the light emission elements and temperature thresholds for changing the colors. The integrated control unit 5a is operable to record and quickly switch the temperature thresholds and the amounts of output power. As such, a user may use the first temperature control unit 51a to set the timing of activation for the first heat dissipation device 2a and the second heat dissipation device 3a individually and the output of power corresponding to each of the temperature thresholds. Similarly, the second temperature control unit 52 may be used to set the timing of activation for the external fan 6 and the output of power corresponding to each of the temperature thresholds. The light control unit 53a is operable to set colors desired to be displayed and a temperature range corresponding to each of the colors. The Integrated control unit 54a may record the preferences of each individual user and enables quickly switching between different sets of preferences.

Specifically, one particular preference set of a user is such that the driving temperature threshold of the first heat dissipation device 2a is set to 30 degrees and the output of power is 500 rpm; the driving temperature threshold of the second heat dissipation device 3a is 50 degrees and the output of power is 300 rpm; the driving temperature threshold of the external fan 6a is 60 degrees and the output of power is 1,500 rpm; and the activating color of the light emission elements is yellowish green; and there is at least another one preference set. In this way, the user is allowed to freely switch between the different preference sets for quickly executing switching of temperature threshold and output of power.

Figure 9:
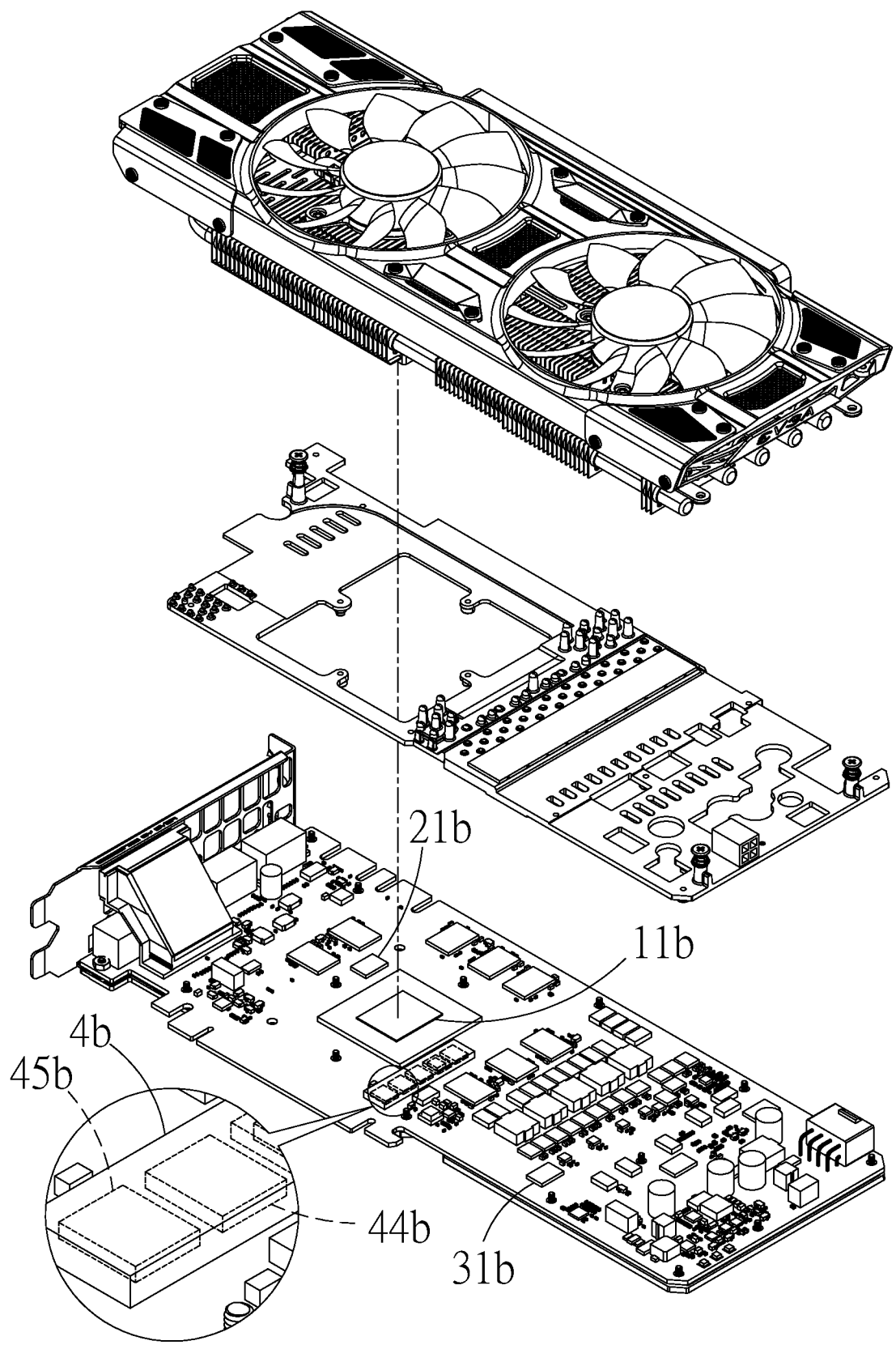
FIG. 9 is an exploded view showing a further preferred embodiment of the present invention.
Figure 10:
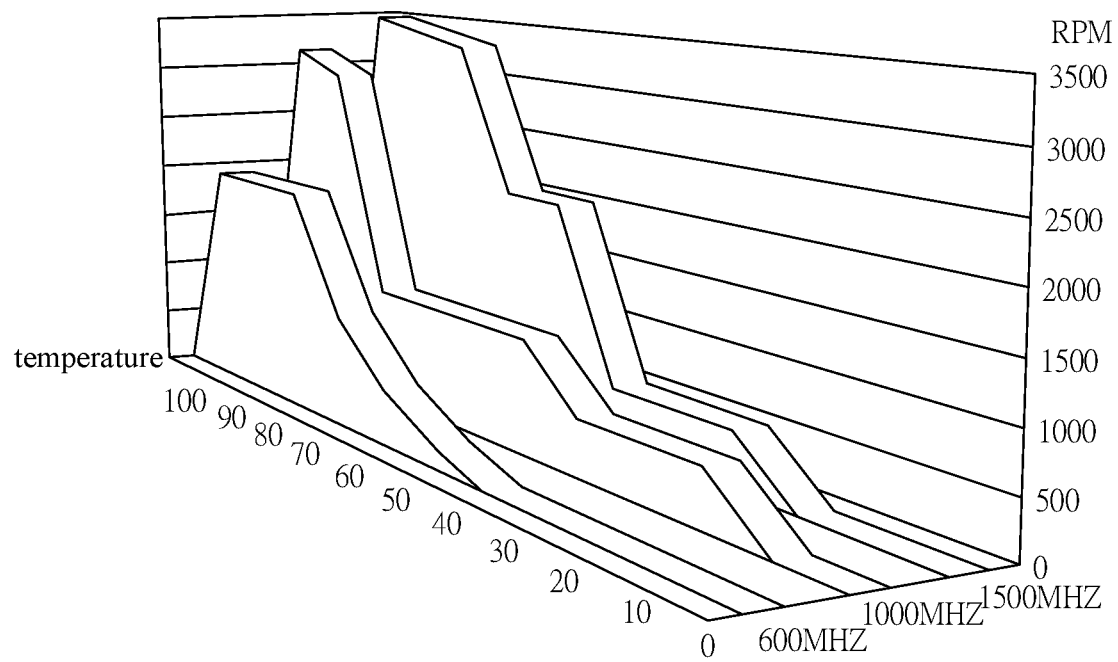
FIG. 10 is a plot showing a three-dimensional rotational speed relationship according to said further preferred embodiment of the present invention.

In FIGS. 9-10, the instant embodiment is only such that a frequency feed-back module 44b that reads and accesses working frequency data of the graphics processor 11b and an integration unit 45b that combines and integrates the temperature data of the first temperature sensor 21b and the second temperature sensors 31b and the working frequency data of the graphics processor 11b to generate control information are included in the control device 4b. As such, conditions or factors that the control device 4b can take into consideration include both temperature and frequency so that the control information can be used to more precisely set heat dissipation performances (which can be for example fan rotational speeds) of the heat dissipation devices. FIG. 10 provides a plot showing a three-dimensional relationship among the temperatures, the working frequency of the graphics processor 11b, and the fan rotational speeds.

I claim:
1. An asynchronous temperature control integrated device, comprising:
   a graphics card body, the graphics card body comprising a graphics processor and a power supply circuit arranged at one side of the graphics processor;
   at least one external fan connection port, which is arranged on the graphics card body;
   a first heat dissipation device, which is arranged on the graphics processor;
   at least one first temperature sensor, which is arranged at one side of the first heat dissipation device;
   a second heat dissipation device, which is arranged on the power supply circuit;
   a plurality of second temperature sensors, which are arranged on the power supply circuit and are electrically connected with the second heat dissipation device;
   a plurality of light emission elements, which are arranged on the graphics card body and are electrically connected with the first temperature sensor and the second temperature sensors to issue temperature alarms with different colors of light;

a control device, which is arranged on the graphics card body and is electrically connected to the first temperature sensor and the second temperature sensors to individually control heat dissipation performances of the first heat dissipation device and the second heat dissipation devices;

an externality control member, which is arranged in the control device and is electrically connected to the external fan connection port;

a high-power drive module, which is arranged in the control device for driving, in a forced manner, the first heat dissipation device and the second heat dissipation device to maximum available output power;

a scenario database, which is arranged in the control device and is electrically connected to the high-power drive module to store therein at least one high-power program list; and a detection unit, which is arranged in the scenario database to detect an operation of activation/deactivation of a high-power program.

2. The asynchronous temperature control integrated device according to claim 1, wherein the control device is communicatively coupled with a control module.

3. The asynchronous temperature control integrated device according to claim 2, wherein the control module comprises a first temperature control unit that is operable to set temperature thresholds for driving the first heat dissipation device and the second heat dissipation device and amounts of output power.

4. The asynchronous temperature control integrated device according to claim 2, wherein the control module comprises a second temperature control unit, which is operable to set a temperature threshold for driving an external fan and an amount of output power.

5. The asynchronous temperature control integrated device according to claim 3, wherein the control module comprises a light control unit, which is operable to set colors of the light emission elements and temperature thresholds for changing the colors.

6. The asynchronous temperature control integrated device according to claim 5, wherein the control module comprises an integrated control unit, which is operable to record preferences of each individual user and quickly switch between different sets of the preferences.

7. The asynchronous temperature control integrated device according to claim 4, wherein the control module comprises a light control unit, which is operable to set colors of the light emission elements and temperature thresholds for changing the colors.

8. The asynchronous temperature control integrated device according to claim 7, wherein control module comprises an integrated control unit, which is operable to record preferences of each individual user and quickly switch between different sets of the preferences.

9. The asynchronous temperature control integrated device according to claim 1, wherein the control device comprises a frequency feed-back module, which reads and accesses working frequency data of the graphics processor.

10. The asynchronous temperature control integrated device according to claim 9, wherein the control device comprises an integration unit, which combines and integrates temperature data of the first temperature sensor, the second temperature sensors, and the working frequency data of the graphics processor to generate control information.

* * * * *